United States Patent [19]

Tanno et al.

[11] Patent Number: 4,914,680
[45] Date of Patent: Apr. 3, 1990

[54] SIGNAL DISTINCTION CIRCUIT

[75] Inventors: Masaya Tanno, Gunma; Tsutomu Ishikawa, Ota, both of Japan

[73] Assignee: Sanyo Electric Co., Ltd., Osaka, Japan

[21] Appl. No.: 199,935

[22] Filed: May 27, 1988

[30] Foreign Application Priority Data

| Jun. 3, 1987 | [JP] | Japan | 62-139238 |
| Jun. 3, 1987 | [JP] | Japan | 62-139239 |
| Jun. 3, 1987 | [JP] | Japan | 62-139240 |
| Jun. 19, 1987 | [JP] | Japan | 62-153773 |

[51] Int. Cl.$^4$ .............................. H03K 5/26
[52] U.S. Cl. ................... 377/49; 328/138; 328/140; 377/44; 455/154
[58] Field of Search ............... 377/49, 44; 328/138, 328/140; 455/154

[56] References Cited

U.S. PATENT DOCUMENTS

| 3,757,233 | 9/1973 | Dixon | 328/138 |
| 4,344,038 | 8/1982 | Streeter | 328/138 |
| 4,419,765 | 12/1983 | Wycoff et al. | 455/36 |
| 4,503,397 | 3/1985 | Schultz | 328/138 |
| 4,737,984 | 4/1988 | Brown | 328/138 |

Primary Examiner—John S. Heyman
Attorney, Agent, or Firm—Darby & Darby

[57] ABSTRACT

A signal distinction circuit comprises a clock signal generating circuit for generating a clock signal whose frequency is longer than that of a pulse signal corresponding to a discrimination signal applied to a counter as an actuating signal; and an arithmetic circuit for operating the pulse signal and the clock signal, and generating an output signal according to the presence or non-presence of the discrimination signal so as to forcibly drive a detecting circuit to which an output signal of the counter is applied, whereby the detecting circuit can be forcibly driven irrespective of the condition of the counter when the discrimination signal is not applied thereto.

6 Claims, 7 Drawing Sheets

SIGNAL DISTINCTION CIRCUIT

BACKGROUND OF THE INVENTION

1. Field of the Invention

The present invention relates to a signal distinction circuit for detecting a discrimination signal having a predetermined frequency, and more particularly, to a signal distinction circuit suitable for detecting a discrimination signal having a low frequency included in an FMX stereophonic broadcasting. The present invention also relates to a signal distinction circuit for detecting a signal by a counter is not malfunctioned when the signal is instantaneously cut off.

2. Description of the Prior Art

Recently, an FMX stereophonic broadcasting is proposed to improve the S/N of an FM stereophonic broadcasting and enlarge a service area. According to the FMX stereophonic broadcasting, a compressed stereophonic difference signal is transmitted simultaneously with the signal of the FM stereophonic broadcasting. The amplitude of the compressed stereophonic difference signal is modulated by a subcarrier of 38 KHz in an orthogonal relationship therewith. A discrimination signal of 10 Hz is included in the signal of the FMX stereophonic broadcasting so that the FMX stereophonic broadcasting is distinguished from the FM stereophonic broadcasting. Therefore, in order to receive the FMX stereophonic broadcasting, it is necessary for a receiver to detect the discrimination signal and switch the receiving mode thereof to the FMX stereophonic receiving mode.

The FMX stereophonic broadcasting is described in detail on pages from 11 through 15 of the September, 1986 edition of the magazine "JAS JOURNAL".

The discrimination signal of 10 Hz can be detected by a signal distinction circuit as shown in FIG. 9. Referring to FIG. 9, a stereophonic pilot signal of 19 KHz applied to a first input terminal 1 is divided into approximately 74 Hz by a first dividing circuit 2 and then, applied to a counter 3 as a clock signal. A discrimination signal of 10 Hz applied to a second input terminal 4 is supplied to a pulse generating circuit 6 through a bandpass filter 5. Therefore, a pulse signal having the same frequency as that of the discrimination signal applied to the input terminal 4 is produced from the pulse generating circuit 6. The pulse signal thus produced is divided by a second dividing circuit 7 and then, supplied to the counter 3 as an actuating signal. As a result, the counter 3 counts the clock signal while the pulse signal maintains an "H" level. A detecting circuit 8 detects whether or not the value counted by the counter 3 equals to a predetermined value.

The signal discrimination circuit shown in FIG. 9 is provided with a level detecting circuit 9 to detect the level of a signal outputted from the output terminal of the bandpass filter 5. The level detecting circuit 9 produces an "L" level signal when the level of the signal supplied thereto is above a predetermined value and produces an "H" level signal when the level of the signal is below the predetermined value. Therefore, when the level of the signal falls for some reason, the level outputted from the level detecting circuit 9 becomes the "H" level, which causes the detecting circuit 8 to be reset.

However, the method of distinguishing the presence of the discrimination signal by the counter has a disadvantage that when the discrimination signal is not applied to the distinction circuit, the counter stops counting the clock signal. As a result, the signal distinction circuit maintains the condition in which the discrimination signal has been applied. For example, when a signal is not received by a receiver caused by a sudden retuning or when a receiver mounted on a vehicle is not capable of receiving a signal because of the fact that it is traveling in a tunnel, the receivers maintain the condition in which they have received discrimination signals despite that discrimination signals are not applied thereto, which causes, for example, an indicator to light erroneously.

Further, when a discrimination signal of 10 Hz included in the signal of an FMX stereophonic broadcasting is distinguished by the distinction circuit shown in FIG. 9, a bandpass filter 5 having a center frequency of 10 Hz is used. It is to be noted that the normal lower cut-off frequency of a program signal of the FMX stereophonic broadcasting is 50 Hz and the normal level of the program signal is greater than that of the discrimination signal. Therefore, a portion of the program signal is applied to the pulse generating circuit 6 through the bandpass filter 5. The pulse generating circuit 6 produces a pulse by detecting a zero crossing. Therefore, when a program signal having a low frequency and a large amplitude leaks from the bandpass filter 5, a narrow width-pulse is generated at the output terminal of the pulse generating circuit 6, which may cause the counter 3 to malfunction in response to the narrow width-pulse.

In addition, in receiving a radio broadcasting having a discrimination signal, the discrimination signal is distorted and its level falls by a multipath interference or an external noise. It is desirable that the condition of a receiver does not change even though the level of the discrimination signal falls so that a listener enjoys listening to the radio. However, in the receiver provided with the signal distinction circuit shown in FIG. 9, the level of the level detecting circuit 9 outputs an "H" level signal caused by the instantaneous fall of the level of the discrimination signal instantaneously, which causes the detecting circuit 8 to be reset. As a result, the state of the receiver changes. For example, when a receiver is receiving the FMX stereophonic broadcasting, the receiver is switched to receive the FM stereophonic broadcasting by an instantaneous fall of a discrimination signal of 10 Hz and a noise level fluctuates, so that a listener feels uncomfortable.

Furthermore, when a multipath interference occurs when the receiver is receiving the FMX stereophonic broadcasting, a received signal and a discrimination signal are distorted. As a result, the value counted by the counter 3 constituting the signal distinction circuit is out of a predetermined range of the detecting circuit 8. As a result, an "L" level signal is outputted from the detecting circuit 8 and the receiving mode is switched to the FM receiving mode. When the signal received by the receiver is subjected to a frequent interference such as by the multipath interference, the level of the signal outputted from the detecting circuit 8 are frequently switched, which causes the indicator to flash and the receiver to an inappropriate state that the FMX stereophonic broadcasting is received in the FM mode.

SUMMARY OF THE INVENTION

The present invention has been made with a view to substantially solving the above-described disadvantages.

It is an object of the present invention to provide a signal distinction circuit comprising a clock signal generating circuit for generating a clock signal whose frequency is lower than that of a pulse signal corresponding to a discrimination signal applied to a counter as an actuating signal; and an arithmetic circuit for operating the pulse signal and the clock signal, and generating an output signal according to the presence or non-presence of the discrimination signal so as to forcibly drive a detecting circuit to which an output signal of the counter is applied.

According to the signal distinction circuit having the above-described construction, the detecting circuit can be forcibly driven irrespective of the condition of the counter when the discrimination signal is not applied thereto because the pulse signal corresponding to the discrimination signal and the clock signal having a frequency longer than that of the pulse signal are operated and a signal to forcibly drive the detecting circuit is generated.

It is another object of the present invention to provide a signal distinction circuit comprising a first pulse generating circuit for generating a pulse corresponding to a discrimination signal; a first counter for counting a clock signal in response to a pulse outputted from the first pulse generating circuit; a second pulse generating circuit for generating a pulse in response to an output signal generated when the first counter has counted a predetermined number of clock pulses; a second counter for counting clock signals in response to a pulse outputted from the second pulse generating circuit; and a detecting circuit for detecting the presence of a discrimination signal according to a value counted by the second counter so as to prevent a malfunction caused by a narrow-width pulse.

According to the above-described construction, even though the first pulse generating circuit receives the signal of a noise whose frequency is higher than that of the discrimination signal in addition to the discrimination signal, the generation of a pulse corresponding to the noise can be prevented. Accordingly, a malfunction caused by the noise can be prevented.

It is a further object of the present invention to provide a signal distinction circuit comprising a level detecting circuit for detecting the level of a discrimination signal; and a reset signal generating circuit comprising a flip-flop circuit set by a signal outputted from the level detecting circuit and reset by a signal outputted from a pulse generating circuit and a shift register which receives a signal outputted from the pulse generating circuit as a clock signal and receives a signal outputted from the flip-flop circuit as a reset signal.

According to the above-described construction, the reset signal generating circuit is controlled by the signal outputted from the pulse generating circuit for generating a pulse corresponding to a discrimination signal and the signal outputted from the level detecting circuit for detecting the level of the discrimination signal. Therefore, after a discrimination signal whose level is higher than a predetermined level is detected, a reset signal is not generated and a reset signal can be generated when a plurality of discrimination signals whose levels are lower than the predetermined level are continuously detected, the reset signal can be produced. Accordingly, the reset signal is generated when the level of the discrimination signal instantaneously falls. Thus, the detecting circuit to which the output signal of the reset signal generating circuit is applied does not respond to the instantaneous cut-off of the discrimination signal.

It is a still further object of the present invention to provide a signal distinction circuit comprising a first distinction circuit for distinguishing whether or not a value counted by a counter is in a first predetermined range; a second distinction circuit for distinguishing whether or not a value counted by the counter is in a second predetermined range wider than the first predetermined range; and an arithmetic circuit for generating an "H" level signal in response to a signal outputted from the first distinction circuit and generating an "L" level signal when a signal is not outputted from the second distinction circuit.

According to the above-described construction, the value counted by the counter is in the first predetermined range narrower than the second predetermined range, a signal indicating the presence of a discrimination signal can be generated. When the value counted by the counter is out of the predetermined second range wider than the first predetermined range, a signal indicating a non-presence of the discrimination signal can be generated. Therefore, the initial detection of the discrimination can be accurately performed. Further, after a discrimination is detected, the margin for detecting the discrimination signal can be enlarged and prevented frequent output change of the detecting circuit.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
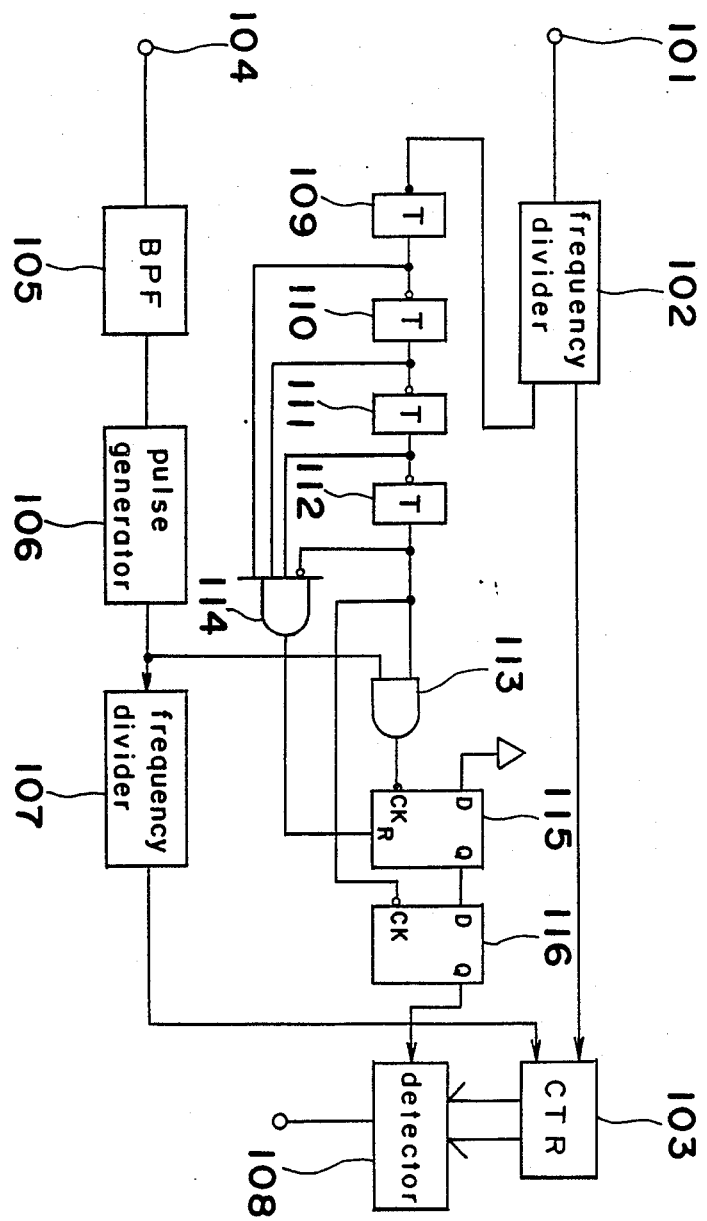
FIG. 1 is a circuit diagram showing a first embodiment of the present invention.

Before the description of the present invention proceeds, it is to be noted that like parts are designated by like reference numerals throughout the accompanying drawings.

First Embodiment

Figure 9:
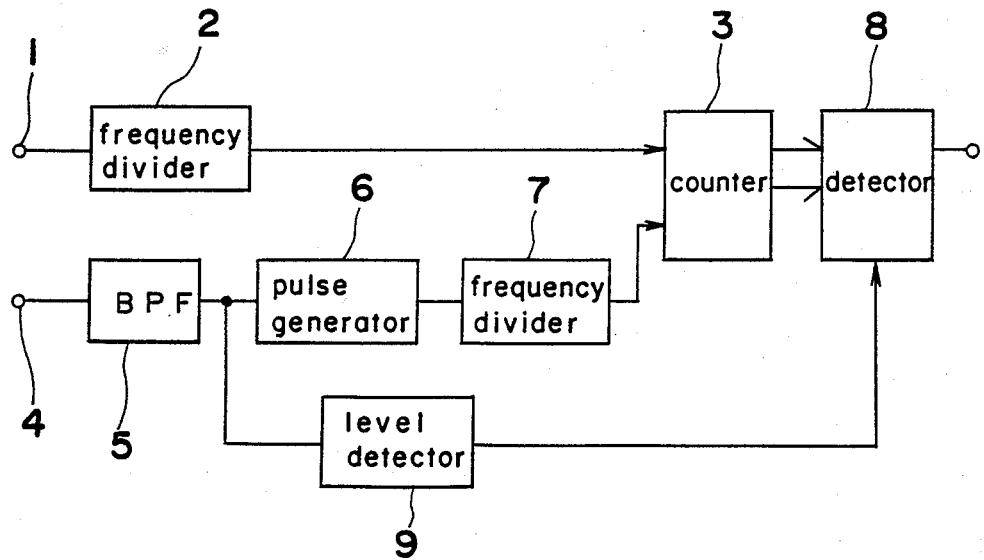
FIG. 9 is a circuit diagram showing a conventional signal distinction circuit.

FIG. 1 is a circuit diagram of a first embodiment of the present invention. The signal distinction circuit comprises first through fourth T-FFs 109, 110, 111, 112 in a cascade connection constituting a divider circuit, a first AND gate 113 which takes the logic of the output signal of the fourth T-FF 112 and the output signal of a pulse generating circuit 106, a second AND gate 114 which takes the logic sum of the first through fourth T-FFs 109 through 112, a first D-FF which receives the output of the first AND gate 113 as the input as a clock signal and the output of the second AND gate 114 as a reset signal, and a second D-FF which receives the Q output of the first D-FF 115 as D input and the output of the fourth T-FF 112 as a clock signal. The circuits other the above described circuits constituting this circuit in FIG. 1 is the same as those shown in FIG. 9. Therefore, the descriptions thereof are omitted herein.

Figure 2:
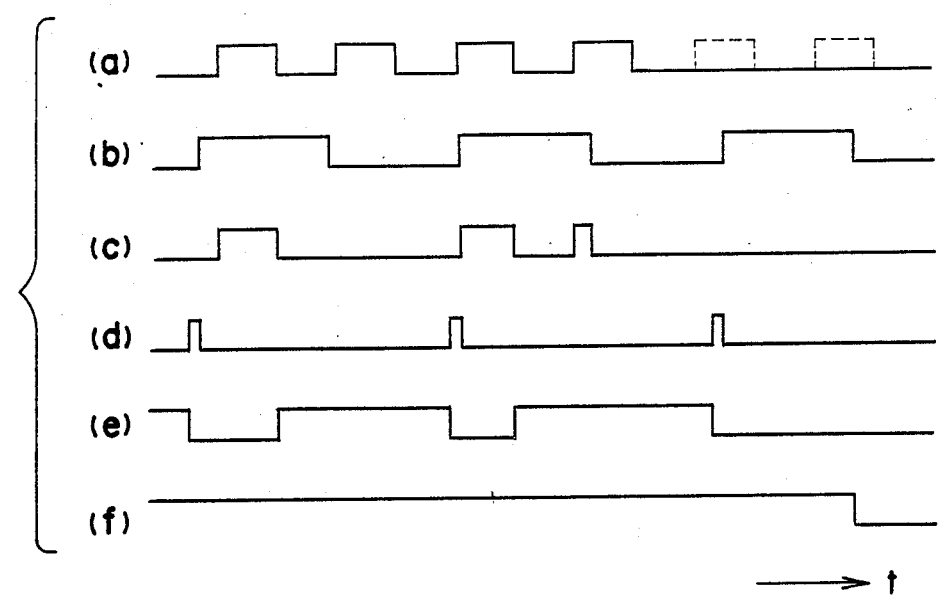
FIG. 2 (*a*) through (*f*) is a characteristic view to explain the first embodiment.

A stereophonic pilot signal of 19 KHz applied to a first input terminal 101 is divided by a divider circuit 102 and thereafter, applied to a counter 103 as a clock signal, and also applied to the first T-FF 109, and further divided by the first through fourth T-FFs 109 through 112. As a result, a clock signal of approximately 4.6 Hz less than half the frequency of a discrimination signal is generated at the output terminal of the fourth T-FF 112. The clock signal of 4.6 Hz and a pulse signal corresponding to the discrimination signal of 10 Hz supplied from the pulse generating circuit 106 are applied to the first AND gate 113. The waveform of the signal outputted from the pulse generating circuit 106 is as shown by (a) in FIG. 2 and the waveform of the signal outputted from the fourth T-FF 112 is as shown by (b) in FIG. 2. Accordingly, the waveform of the signal outputted from the first AND gate 113 is as shown by (c) in FIG. 2. A reset signal as shown by (d) in FIG. 2 is outputted from the second AND gate 114 whose input terminal is connected to the output terminals of the first through fourth T-FFs 109 through 112. The reset signal is applied to the reset terminal of the first D-FF 115. As a result, a signal is generated as the Q output of the first D-FF 115. The level of this signal becomes "L" as shown by (e) in FIG. 2 in response to the reset signal and an becomes "H" when the output signal (shown by (c) in FIG. 2) of the first AND gate 113 falls. The Q output of the first D-FF 115 is connected to the D input of the second D-FF 116 and the clock signal outputted from the fourth T-FF 112 is applied to the clock input of the second D-FF 116. A signal as shown by (f) in FIG. 2 is generated at the Q output of the second D-FF 116. The level of this signal is "H" while the signal is intermittently outputted from the first AND gate 113. The level of the output signal of the second D-FF 116 becomes "L" when a signal is not outputted from the first AND gate 113, i.e., a discrimination signal is not inputted to a second input terminal 104. Accordingly, whether or not a discrimination signal is applied to the signal distinction circuit can be detected by the level of the output signal of the second D-FF 116. The detecting circuit 108 is forced to be driven by the signal outputted from the second D-FF 116. Therefore, irrespective of the state ("H" or "L") of the output signal of the counter 103, and "L" level signal is outputted from the detecting circuit 108 and the "L" level signal is applied to the respective portions of the receiver. Thus, the switching of the receiver is effected.

According to the first embodiment, since the discrimination signal is detected by the counter, a malfunction that the signal of a noise is distinguished as a discrimination signal can be prevented. Further, when the discrimination signal is not applied to the signal distinction circuit, a malfunction caused by the clocking of the counter can be prevented since the detecting circuit is forcibly switched by the output signal of the arithmetic circuit. Since a signal distinction circuit according to the present invention is capable of accurately distinguishing the presence of a discrimination signal, it can be preferably utilized as a receiver for an FMX stereophonic broadcasting.

Second Embodiment

Figure 3:
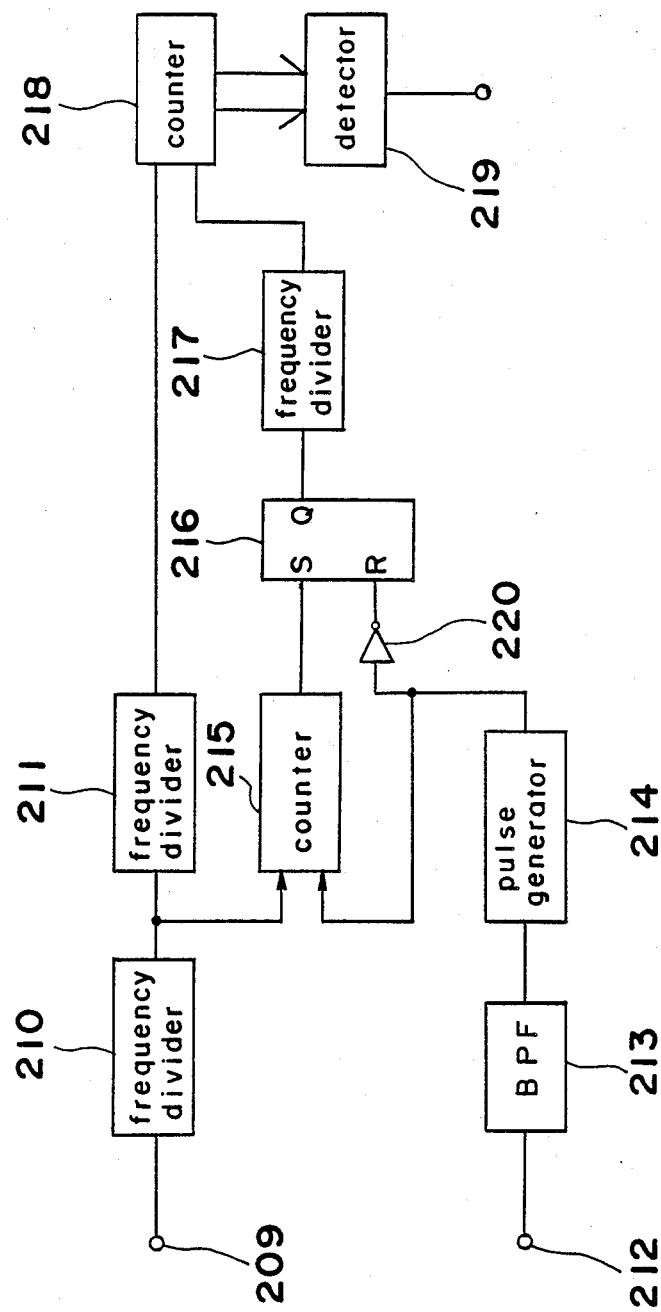
FIG. 3 is a circuit diagram showing a second embodiment of the present invention.

FIG. 3 is a circuit diagram of a second embodiment of the present invention. The signal distinction circuit comprises a first input terminal 209 to which a stereophonic pilot signal of 19 KHz is applied, a first divider circuit 210 for dividing the stereophonic pilot signal to generate a first clock signal of, for example, 1.2 KHz, a second divider circuit 211 for dividing the first clock signal to generate a second clock signal of, for example, 74 Hz, a second input terminal 212 to which a discrimination signal is applied, a band pass filter 213 for attenuating signals except the discrimination signal to be applied to the second input terminal 212, a first pulse generating circuit 214 for generating a pulse corresponding to the output signal of the bandpass filter 213, a first counter 215 for counting the clock outputted from the first divider 210 when the level of the signal outputted from the first pulse generating circuit 214 is "H", a flip-flop circuit 216 set in response to the output signal of the first counter 215 and reset in response to the output signal of the first pulse generating circuit 214, a third divider circuit 217 for dividing the output signal of the flip-flop circuit 216, a second counter 218 for counting the output clock signal of the second divider circuit 211 when the level of the output signal of the third divider circuit 217 is "H", and a detecting circuit 219 for detecting that the value counted by the second counter 218 has attached a predetermined value to produce a signal. The flip-flop circuit 216 operates as a second pulse generating circuit.

Figure 4:
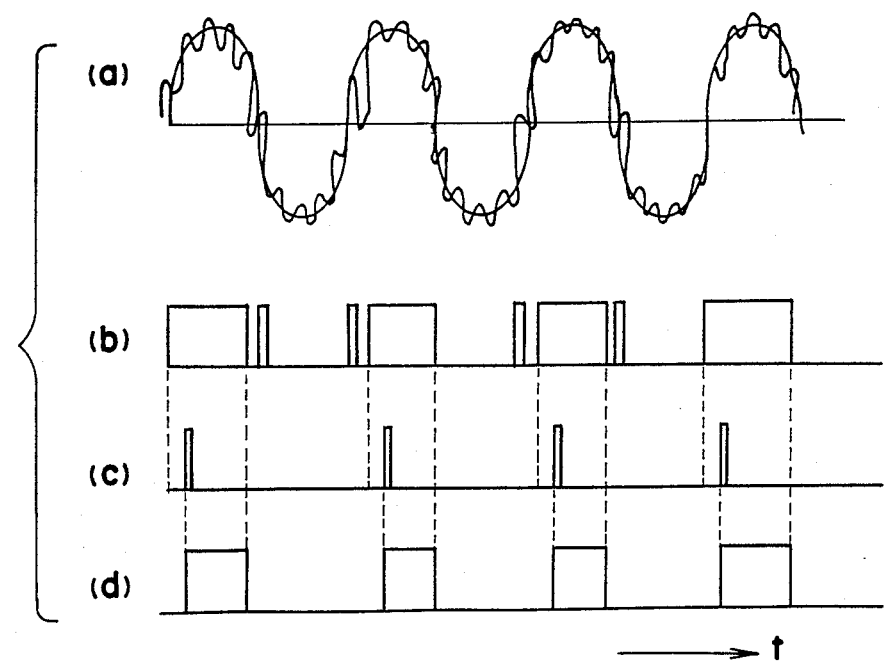
FIG. 4 (*a*) through (*d*) is a characteristic view to explain the second embodiment.

A discrimination signal applied to the second input terminal 212 is supplied to the first pulse generating circuit 214 through the bandpass filter 213. Subsequently, a pulse corresponding to the inputted discrimination signal is produced from the first pulse generating circuit 214 which generates a pulse according to the zero crossing of an inputted discrimination signal. Assuming that the discrimination signal and a noise (program signal) having a frequency higher than that of the discrimination signal are applied to the second input terminal 212 and a signal shown by (a) in FIG. 4 is generated from the bandpass filter 213, a signal shown by (b) in FIG. 4 is generated from the first pulse generating circuit 214. The signal shown by (b) in FIG. 4 includes a narrow width-pulse caused by the noise. The first counter 215 starts counting in response to the signal outputted from the pulse generating circuit 214. When the first counter 215 has counted approximately 40 clock signals of 1.2 Khz, a signal (shown by (c) in FIG. 4) is outputted from the first counter 215, thereby the flip-flop circuit 216 being set. The signal outputted from the first pulse generating circuit 214 is inverted by an inverter 220 and applied to the reset terminal of the flip-flop circuit 216. As a result, the flip-flop circuit 216 is reset when the signal outputted from the first pulse generating circuit 214 has been risen. When the pulse width of the signal outputted from the first pulse generating circuit 214 is sufficiently long, the first counter 215 counts 40 clock signals of 1.2 KHz, which causes the flip-flop circuit 216 to be set, whereas when the pulse width of the signal outputted from the first pulse generating circuit 214 is short, the first counter 215 does not perform a clock counting of 40. Thus, the flip-flop circuit 216 is not set. In this case, a signal shown by (d) in FIG. 4 is outputted from the flip-flop circuit 216 according to the signal shown by (b) in FIG. 4.

The signal outputted from the flip-flop circuit 216 is divided by a third divider circuit 217 and applied to the second counter 218 as an actuating signal. As a result, the second counter 218 counts the clock signals of 74 Hz outputted from the second divider circuit 211 when the level of the output signal of the third divider circuit 217 is "H". The data obtained as a result of the counting of the second counter 218 is supplied to the detecting circuit 219 and compared with a reference data. If the data counted by the second counter 218 coincides with the reference data or if the difference between the former and the latter is within a predetermined range, it is detected that a discrimination signal has been applied to the signal distinction circuit. In this case, an "H" level signal is generated from the detecting circuit 219. If the difference between both data is great, the level of the signal outputted from the detecting circuit 219 becomes "L". In this case, it is detected that a discrimination signal has not been inputted to the signal distinction circuit. Thus, whether or not a discrimination signal has been applied to the signal distinction circuit can be detected by the level of the signal outputted from the detecting circuit 219. The detecting circuit 219 has a latch function and as such, maintains the present state until a new data is inputted thereto.

As described above, according to the second embodiment of the present invention, the signal distinction circuit is capable of accurately detecting whether or not a discrimination signal has been applied thereto. Further, according to the present invention, when a noise whose frequency is higher than that of the discrimination signal is mixed therewith, the influence resulting from the noise can be removed therefrom. Thus, the signal of the noise can be reliably distinguished from the signal of the discrimination signal.

Third Embodiment

Figure 5:
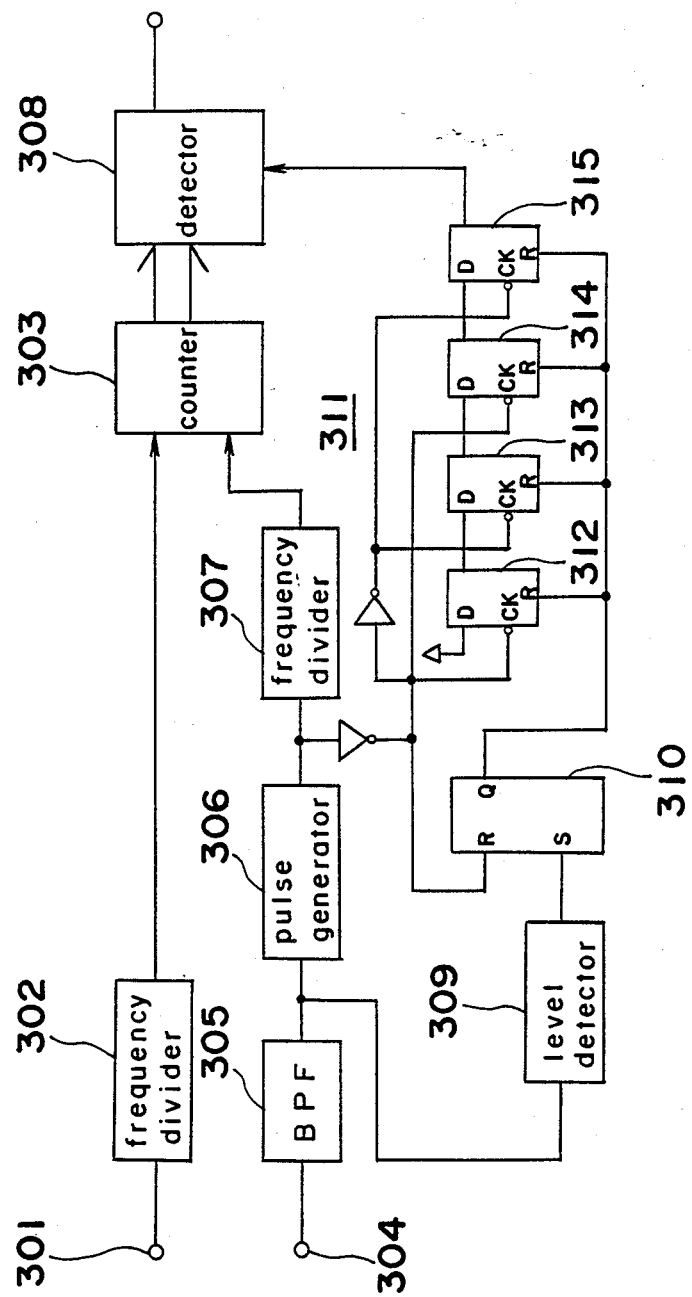
FIG. 5 is a circuit diagram showing a third embodiment of the present invention.

FIG. 5 is a circuit diagram showing a third embodiment of the present invention. The signal distinction circuit comprises a flip-flop circuit 310 set by the output signal of a level detecting circuit 309 which detects the level of a discrimination signal and reset by the inversion signal outputted from a pulse generating circuit 306 and a shift register 311 which comprises first D-FF through fourth D-FFs 312 through 315 in a cascade connection relationship and receives the signal outputted from the pulse generating circuit 306 as the clock signal and receives the output signal of flip-flop circuit 310 as a reset signal. The first through third D-FFs 312 through 314 receive the inverted signal outputted from the pulse generating circuit 306 as clock signals and the second through fourth D-FFs 313 through 315 receive the non-inversion output signal of the pulse generating circuit 306 as clock signals. Since the output signal of the flip-flop circuit 310 is applied to the first D-FF through the fourth D-FFs 312 through 315, respectively, the D-FFs 312 through 315 are simultaneously reset. The flip-flop circuit 310 and the shift register 311 comprising the first D-FF through fourth D-FFs 312 through 315 operate as reset signal generating circuits for generating the signal to reset the detecting circuit 308.

Figure 6:
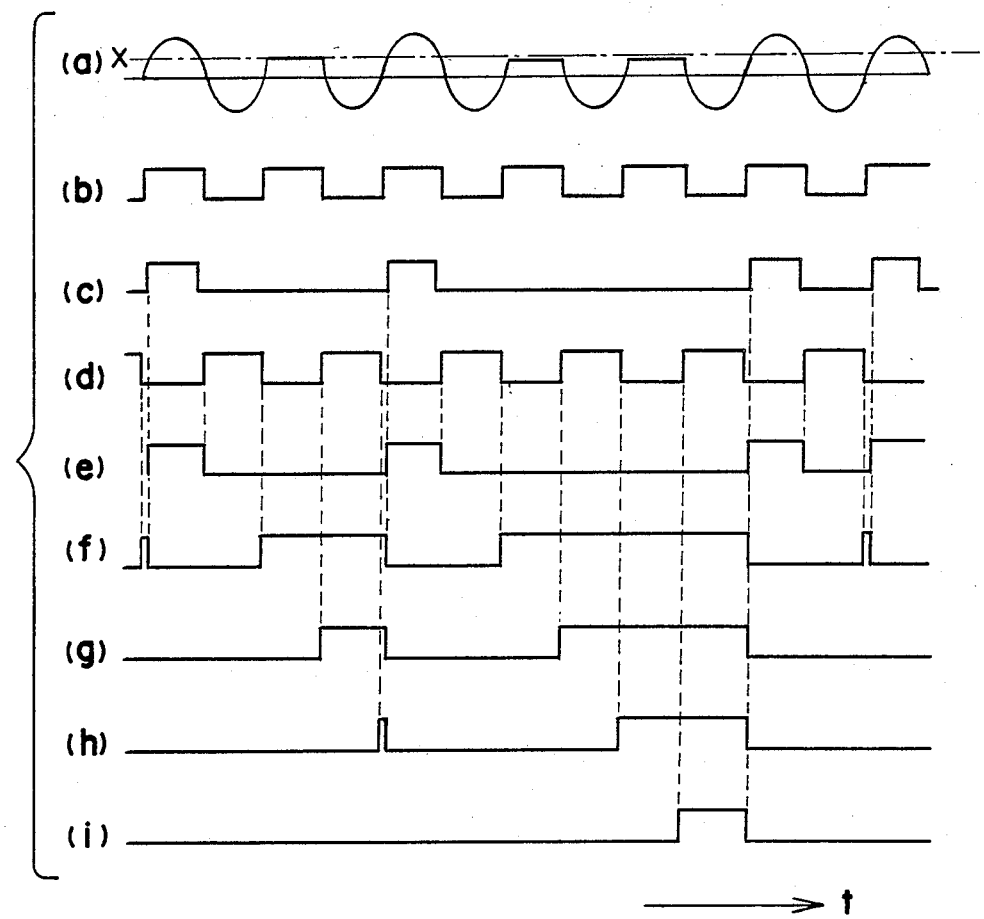
FIG. 6 (*a*) through (*h*) is a characteristic view to explain the third embodiment.

Next, the operation of the signal distinction circuit of this embodiment is described hereinbelow with reference to the characteristic view shown in FIG. 6. Assuming that a discrimination signal as shown by (a) in FIG. 6 is outputted from the bandpass filter 305, a signal as shown by (b) in FIG. 6 is generated at the output terminal of the pulse generating circuit 306 which generates a pulse by detecting a zero crossing. A signal as shown by (c) in FIG. 6 is generated at the output terminal of the level generating circuit 309 which generates an "H" level signal when a signal whose frequency is higher than its threshold level (X) is inputted thereto and generates an "L" level signal when a signal whose frequency is lower than the predetermined threshold level (X) is inputted thereto. Since the output signal of the level detecting circuit 309 is applied to the flip-flop circuit 310 as a set signal, the level of the Q output of the flip-flop circuit 310 becomes "H" in response to the rise of the signal outputted from the level detecting circuit 309. The inverted output signal (shown by (d) in FIG. 6) of the pulse generating circuit 306 is applied to the flip-flop circuit 310 as a reset signal. Consequently, the level of the Q output of the flip-flop circuit 310 becomes "L" in response to the rise of the inverted output signal. Accordingly, the waveform of the signal outputted from the Q output of the flip-flop circuit 310 is as shown by (e) in FIG. 6. The inverted output of the pulse generating circuit 306 is applied to the first D-FF 312. Caused by this, the waveform of the output signal of the first D-FF 312 is as shown by (g) in FIG. 6. The inverted output of the pulse generating circuit 306 is also applied the second through fourth D-FFs 313 through 315, the waveforms of output signals of the second D-FF 313 through fourth D-FFs 313 through 315 are as shown by (f), (g), and (h) in FIG. 6.

The signal (shown by (h) in FIG. 6) outputted from the fourth D-FF 315 is applied to the detecting circuit 308 as a reset signal. As apparent from the comparison of the signal (shown by (a) in FIG. 6) outputted from the bandpass filter 305 with the signal (shown by (h) in FIG. 6) outputted from the fourth D-FF 315, when a discrimination signal having a normal level is obtained, the level of the signal outputted from the fourth D-FF 315 becomes "L", so that the detecting circuit 308 is not reset. If the discrimination signal lacks one cycle, the level of the signal outputted from the fourth D-FF 315 is kept "L". If the discrimination signal lacks two cycles or more, the level of the signal outputted from the fourth D-FF 315 becomes "H". Accordingly, the reset signal generating circuit comprising the flip-flop circuit 310 and the shift register 311 does not respond to the instantaneous lack of the discrimination signal. Since the detecting circuit 308 is not reset when the level of the signal outputted from the bandpass filter 305 is higher than the predetermined value in the signal distinction circuit of this embodiment, the value counted by the counter 303 is detected by the detecting circuit 308. That is, fi the detecting circuit 308 detects that a value counted by the counter 308 is in the predetermined range, it outputs an "H" level signal and if it detects that a value counted by the counter 308 is out of the predetermined range, it outputs an "L" level signal. If an instantaneous lack occurs in the signal outputted form the bandpass filter 305, a reset signal is not produced from the fourth D-FF 315. Accordingly, the detecting circuit 308 is not reset, i.e., it maintains the present state until a new data is supplied from the counter 303. If a signal is not outputted from the bandpass filter 305 for a certain period of time, a reset signal is outputted from the fourth D-FF 315. As a result, the detecting circuit 308 is reset, that is, the level of the signal outputted from the detecting circuit 308 is rendered to be "L".

A receiver comprising the signal distinction circuit shown in FIG. 5 is capable of detecting a discrimination signal of 10 Hz when it receives a signal of the FMX stereophonic broadcasting. If the signal distinction circuit instantaneously lacks a discrimination signal of 10 Hz, the level of the distinction output thereof is not changed, i.e., it maintains the state in which the receiver has been turned on to receive the FMX stereophonic broadcasting, with the result that a noise level does not change suddenly.

As apparent from the foregoing description, the signal distinction circuit of the third embodiment is capable of accurately distinguishing a discrimination signal from the signal of a noise or the like. Further, the present invention provides a signal distinction circuit which is not affected by the instantaneous lack of the discrimination signal. Thus, the signal distinction circuit can be preferably provided with a receiver so as to detect the discrimination signal of the FMX stereophonic broadcasting.

Fourth Embodiment

Figure 7:
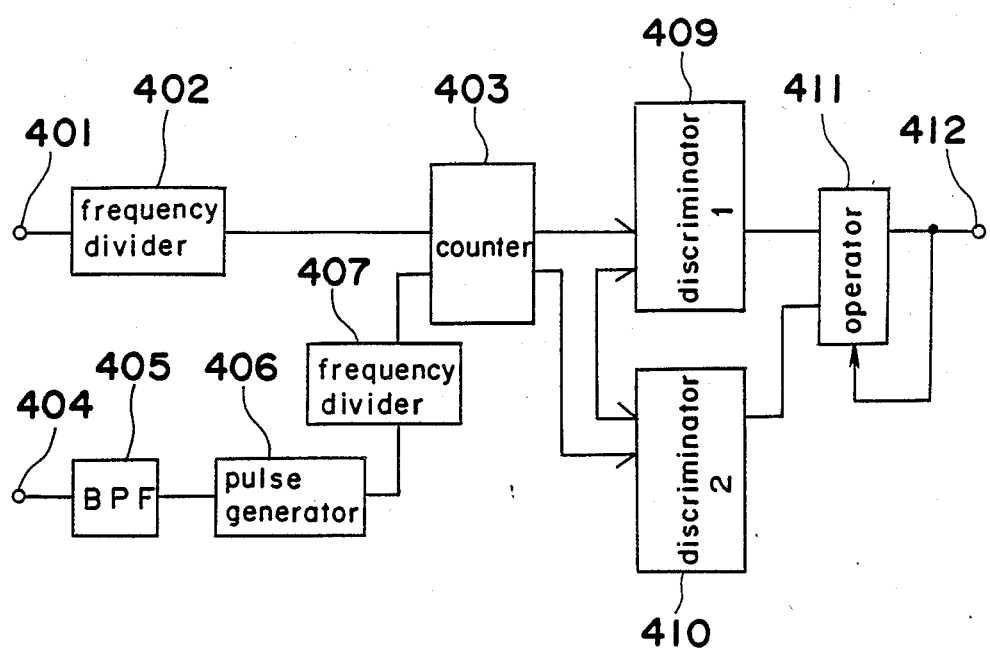
FIG. 7 is a circuit diagram showing a fourth embodiment of the present invention.

FIG. 7 is a circuit diagram showing a fourth embodiment of the present invention. The signal distinction circuit comprises a first distinction circuit 409 for detecting whether or not a value counted by a counter 403 is in a first predetermined range (for example, 56~62), a second distinction circuit 410 for detecting whether or not a value counted by the counter 403 is in a second predetermined range (for example, 50~68), and an arithmetic circuit, 411 for operating signals outputted from the first and second distinction circuits 409 and 410. Other circuits have the same constructions and functions as those shown in FIG. 9. Therefore, the description of thereof is omitted herein.

Assuming that the receiver is receiving, for example, the signal of an FM stereophonic broadcasting including no discrimination signals, a counter 403 does not perform a counting operation because no discrimination signals are applied to a second input terminal 404, i.e., the value of the counter 403 is kept 0. Therefore, the levels of the signals outputted from the first and second distinction circuits 409 and 410 are kept "L" and as such, the level of the output signal of the arithmetic circuit 411 becomes also "L". Let it be considered that the signal of a noise is applied to the second input terminal 404 through the bandpass filter 405, and a pulse signal is generated from the a pulse generating circuit 406, and thereafter, the counter 404 counts clock signals. However, unless a value counted by the counter 403 is within the first predetermined range which is relatively narrow, the arithmetic circuit 411 does not generate an "H" level signal. Thus, if the receiver is receiving a signal including no discrimination signals, the receiver does not malfunction caused by the noise.

Assuming that the receiver is receiving a signal including a discrimination signal, for example, a signal of the FMX. stereophonic broadcasting, the discrimination signal is applied to the second input terminal 404 and the pulse generating circuit 406 generates a pulse signal corresponding to the discrimination signal. In response to the generated pulse signal, the counter 403 counts clock signals and a value counted by the counter 403 is applied to the first and second distinction circuits 409 and 410. If the value is in the first predetermined range, the first distinction circuit 409 generates a signal, which causes the arithmetic circuit 411 to output an "H" level signal indicating that the discrimination has been applied to the signal distinction circuit. If the value is within the second predetermined range, but is not out of the first predetermined range, the arithmetic circuit 411 does not produce an "H" level signal. Thus, the signal detection circuit of this embodiment detects a discrimination very promptly.

When it is detected that the discrimination signal has been applied to the signal distinction circuit and the "H" level signal is produced at the output terminal 412, the discrimination signal is fed back to the arithmetic circuit 411. Thereafter, the signal distinction circuit distinguishes the discrimination signal from the signal included in a noise or the like based on the second predetermined range. That is, when a value counted by the counter 403 is in the second predetermined range, but out of the first predetermined range, the arithmetic circuit 411 keeps outputting the "H" level signal. When a value counted by the counter 403 is out of the second predetermined range, the arithmetic circuit 411 outputs an "L" level signal indicating that no discrimination signal has been inputted to the second input terminal 404. Accordingly, if a discrimination signal is distorted by a multipath interference or the like which causes the pulse width of the pulse signal outputted from the pulse generating circuit 406 to vary in a small extent, the signal detecting circuit keeps outputting a signal indicating that a discrimination signal is present therein.

Figure 8:
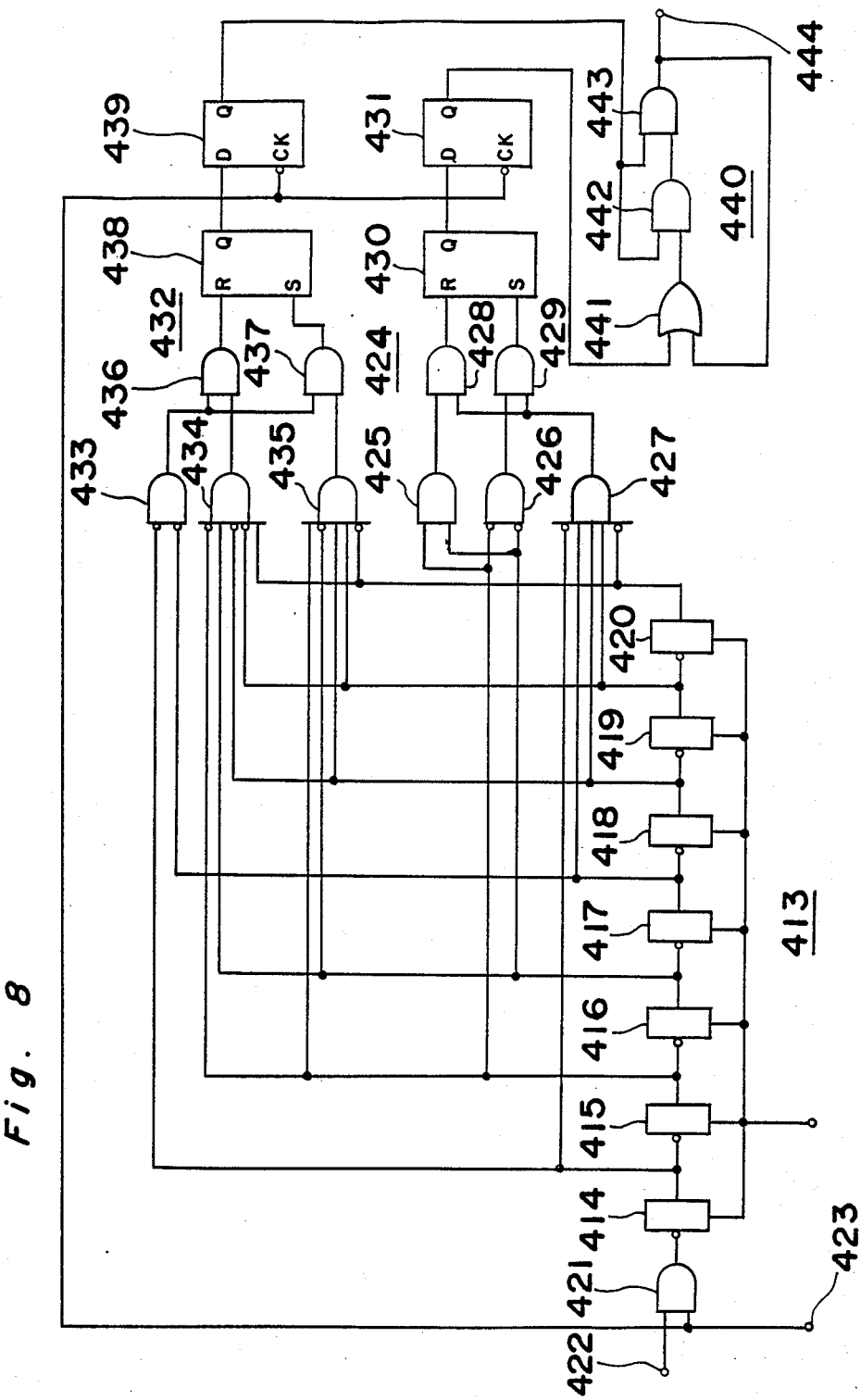
FIG. 8 is a circuit diagram showing a specific example of the circuit shown in FIG. 7.

FIG. 8 is a circuit diagram showing a specific example of the signal distinction circuit shown in FIG. 7. The signal distinction circuit comprises a counter 413 composed of first through seventh T-FFs 414 through 420 in a cascade connection, an AND gate 421 for passing a clock signal applied to a terminal 422 as a pulse signal corresponding to a discrimination signal applied to a terminal 423, a first distinction circuit 424 which comprises a plurality of AND gates 425, 426, 427, 428, 429, an RS-FF 430, and a D-FF 431 and detects whether or not a value counted by the counter 413 is in the first predetermined range (56~62), a second distinction circuit 432 which comprises a plurality of AND gates 433, 434, 435, 436, 437, an RS-FF 438, and a D-FF 439 and detects whether or not a value counted by the counter 413 is in the second predetermined range (50~68), and an arithmetic circuit 440 which comprises an OR gate 441, AND gates 442 and 443 and performs an operation of the first and second distinction circuits 424 and 432.

A clock signal applied to the terminal 422 is produced by dividing a stereophonic pilot signal of 19 KHz by 256 and has a frequency of approximately 74 Hz. A pulse signal applied to the terminal 423 is produced by dividing a pulse corresponding to a discrimination signal of 10 Hz by 16 and has a frequency of approximately 0.6 Hz. Therefore, when a normal discrimination signal is applied to the terminal 423, a value counted by the counter 413 is always in the first predetermined range (56~62). When the counter 413 has counted 56 clock signals, the AND gate 429 of the first distinction circuit 424 outputs an "H" level signal and when the counter 413 has counted 62 clock signals, the AND gate 428 of the first distinction circuit 424 outputs an "H" level signal. Thus, the RS-FF 430 generates an "H" level signal when the value counted by the counter 413 is in the range from 56 to 62. When the counter 413 has counted 50 clock signals, the AND gate 437 of the second distinction circuit 432 produces an "H" level signal and when the counter 413 has counted 68 clock signals, the AND gate 436 of the second distinction circuit 432 produces an "H" level signal. Thus, the RS-FF 438 generates an "H" level signal when a value counted by the counter 413 is in the range from 50 to 68. The D-FFs 431 and 439 receive pulse signals applied to the terminal 423 as clock signals and receive the signals outputted from the RS-FFs 430 and 438 as D inputs thereof, respectively. Therefore, when the pulse signal has fallen and when the counter 413 has completed counting, the D-FFs 431 and 439 receive the signals outputted from the RS-FFs 430 and 438, respectively and output them. The signal outputted from the D-FF 431 is applied to the OR gate 441 constituting the arithmetic circuit 440 and the signal outputted from the D-FF 439 is applied to the AND gates 442 and 443. The signal obtained at the output terminal 444 is fed back to the input of the OR gate 441. Accordingly, when the D-FFs 431 and 439 output "L" level signals, the level of the signal obtained at the output terminal 444 is "L". When the D-FFs 431 and 439 output "H" level signals, the level of the signal obtained at the output terminal 444 is "H". Since the "H" level signal from the output terminal 444 is fed back to the OR gate 441, the level of the output of the output terminal 444 is kept "H" if the level of the signal outputted from the D-FF 439 is kept "H". When the level of the signal outputted from the D-FF 439 becomes "L", the level of the output signal obtained at the output terminal 444 changes from "H" to "L".

If the receiver is receiving a signal of an FM stereophonic broadcasting including no discrimination signals, the counter 413 does not perform a counting operation and the levels of the signals outputted from the D-FFs 431 and 439 are both "L". Therefore, no signal is produced at the output terminal 444. When the receiver has received a signal of an FMX stereophonic broadcasting including a discrimination signal of 10 Hz, a value counted by the counter 413 is in the predetermined range (for example, 58), with the result that "H" level signals are outputted from the D-FFs 431 and 439 and the output terminal 444 outputs an "H"level signal indicating that the presence of a discrimination signal. If, in this state, the discrimination signal is distorted by a multipath interference and a value counted by the counter 413 has increased or reduced to some extent (for example, 52 or 66) caused by the multipath interference, the level of the signal outputted from the D-FF 431 changes to "L", but the signal outputted from the D-FF 439 maintains "H" level. As a result, the level of the output signal obtained at the output terminal 444 is "H". Thus, the presence of the discrimination signal is detected. When the value counted by the counter 413 becomes below 49 or above 69 caused by a great distortion of a discrimination signal or the switching of the receiving mode, the level of the output signal of the D-FF 439 becomes "L". Consequently, the level of the output signal obtained at the output terminal 444 becomes "L". Thus, it is detected that no discrimination signals is present in the signal distinction circuit.

Thus, the signal distinction circuit shown in FIG. 8 detects a discrimination signal very promptly. Once a discrimination signal has been detected, discrimination signals subsequently applied to the signal distinction circuit can be detected in a large margin.

As described above, according to the fifth embodiment of the present invention, when a receiver is receiving a signal including no discrimination signals, a malfunction does not occur even though a noise signal is applied to the receiver because the signal is detected in a low detection sensitivity. When the receiver is receiving a signal including a discrimination signal, the discrimination signal can be reliably detected even though the discrimination is distorted and the pulse width thereof changes caused by a multipath interference or the like because the signal is detected in a high detection sensitivity. Accordingly, the signal distinction circuit in accordance with the present invention is capable of preventing a malfunction from occurring.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A signal distinction circuit having a pulse generating circuit for generating a pulse corresponding to a discrimination signal, a first clock signal generating circuit for generation first clock signals whose frequency is higher than that of a pulse outputted from said pulse generating circuit, a counter for counting said first clock signals in response to a pulse outputted from said pulse generating circuit, and a detecting circuit for detecting the presence of said discrimination signal according to a value counted by said counter, the signal distinction circuit comprising:

a second clock signal generating circuit for generating second clock signals whose frequency is lower than that of a pulse outputted from said pulse generating circuit; and an arithmetic circuit for operating signals outputted from said pulse generating circuit and said clock signal generating circuit so as to generate an output signal;

said detecting circuit being forcibly driven by a signal outputted from said arithmetic circuit.

2. A signal distinction circuit as claimed in claim 1, wherein said second clock signal generating circuit comprises a divider for dividing the output signals from said circuit clock signal generating circuit.

3. A signal distinction circuit as claimed in claim 2, wherein said arithmetic circuit comprises an AND gate for receiving the pulse generated from said pulse generating circuit and the second clock signals generated from said second clock signal generating circuit, and a data flip-flop circuit for receiving an output signal from said AND gate as clocks, said detecting circuit being forcibly driven in response to an output signal from said data flip-flop.

4. A signal distinction circuit comprising:

a first pulse generating circuit for generating a pulse corresponding to a discrimination signal;

a first counter for counting clock signals in response to a first pulse outputted from said first pulse generating circuit;

a second pulse generating circuit for generating a second pulse in response to an output signal generated when said first counter has counted a predetermined number of clock signals;

a second counter for counting clock signals in response to said second pulse outputted from said second pulse generating circuit; and a detecting circuit for detecting the presence of a discrimination signal according to a value counted by said second counter.

5. A signal distinction circuit having a pulse generating circuit for generating a pulse corresponding to a discrimination signal, a counter for counting clock signals from a clock signal generating circuit in response to a signal outputted from said pulse generating circuit, and a detecting circuit for detecting the presence of said discrimination signal according to a value counted by said counter, the signal distinction circuit comprising:

a level detecting circuit for detecting the level of said discrimination signal; and a reset signal generating circuit comprising a flip-flop circuit set by a signal outputted from said level detecting circuit and reset by a signal outputted from said pulse generating circuit and a shift register to which said signal outputted from said pulse generating circuit is applied as one of said clock signals and a signal outputted from said flip-flop circuit is applied as a reset signal;

said detecting circuit being reset by a signal outputted from said reset signal generating circuit.

6. A signal distinction circuit for distinguishing the presence of a discrimination signal included in a received signal, the signal distinction circuit comprising:

a pulse generating circuit for generating a pulse corresponding to said discrimination signal;

a counter for counting clock signals in response to a pulse outputted from said pulse generating circuit;

a first discrimination circuit for discriminating whether or not a value counted by said counter is in a first predetermined range;

a second discrimination circuit for discriminating whether or not the value counted by said counter is in a second predetermined range wider than said first predetermined range; and an arithmetic circuit for operating signals outputted from said first and second discrimination circuits;

whereby an output signal which indicates the presence of said discrimination signal immediately in response to a signal outputted from said first discrimination circuit is generated, and an output signal which indicates the non-presence of said discrimination signal according to the non-presence of an output signal from said second discrimination circuit is generated.

* * * * *